(12) United States Patent
Gong et al.

(10) Patent No.: US 12,176,850 B2
(45) Date of Patent: Dec. 24, 2024

(54) SOLAR CELLS, SOLID-STATE SUPERCAPACITORS, AND WIRELESS SELF-CHARGING POWER PACKS FORMED THEREWITH USING CONDUCTIVE THIN FILMS

(71) Applicant: Xiong Gong, Hudson, OH (US)

(72) Inventors: Xiong Gong, Hudson, OH (US); Tao Zhu, Akron, OH (US); Yongrui Yang, Cuyahoga Falls, OH (US)

(73) Assignee: The University of Akron, Akron, OH (US)

( * ) Notice: Subject to any disclaimer, the term of this patent is extended or adjusted under 35 U.S.C. 154(b) by 0 days.

(21) Appl. No.: 17/492,024

(22) Filed: Oct. 1, 2021

(65) Prior Publication Data

US 2022/0109402 A1   Apr. 7, 2022

Related U.S. Application Data

(60) Provisional application No. 63/086,376, filed on Oct. 1, 2020.

(51) Int. Cl.
| | |
|---|---|
| *H02S 40/38* | (2014.01) |
| *H01G 9/20* | (2006.01) |
| *H01G 11/24* | (2013.01) |
| *H01G 11/32* | (2013.01) |
| *H01G 11/48* | (2013.01) |
| *H01G 11/56* | (2013.01) |

(Continued)

(52) U.S. Cl.
CPC ........... *H02S 40/38* (2014.12); *H01G 9/2009* (2013.01); *H01G 9/2072* (2013.01); *H01G 11/24* (2013.01); *H01G 11/32* (2013.01); *H01G 11/48* (2013.01); *H01G 11/56* (2013.01); *H10K 30/30* (2023.02); *H10K 30/57* (2023.02); *H10K 71/611* (2023.02); *H10K 85/30* (2023.02); *H02J 2300/24* (2020.01)

(58) Field of Classification Search
CPC ........ H02S 40/38; H10K 30/30; H10K 30/57; H10K 85/30; H10K 71/611; H01G 11/24; H01G 11/32; H01G 11/48; H01G 11/56; H01G 9/2072; H01G 9/2009
See application file for complete search history.

(56) References Cited

U.S. PATENT DOCUMENTS

2012/0140378 A1*  6/2012  Tan .................. H01G 11/46
                                                     429/491

FOREIGN PATENT DOCUMENTS

| CN | 104900672 A | * | 9/2015 | |
|---|---|---|---|---|
| CN | 110698516 A | * | 1/2020 | ........ C07F 15/0086 |
| WO | WO-2019072163 A1 | * | 4/2019 | |

OTHER PUBLICATIONS

CN-104900672-A English machine translation (Year: 2015).*

(Continued)

*Primary Examiner* — Andrew J Golden
(74) *Attorney, Agent, or Firm* — Renner, Kenner, Greive, Bobak, Taylor & Weber

(57) ABSTRACT

A wireless self-charging power pack including a solution processed conductive thin film integrating a solar cell with a solid-state supercapacitor. Additionally, a method of forming a wireless self-charging power pack including integrating a solar cell with a solid-state supercapacitor by forming a layer of conductive thin film between the solar cell and the solid-state supercapacitor through solution processing of the material forming the conductive thin film.

19 Claims, 2 Drawing Sheets

(51) Int. Cl.
  *H10K 30/30*   (2023.01)
  *H10K 30/57*   (2023.01)
  *H10K 71/60*   (2023.01)
  *H10K 85/30*   (2023.01)

(56) References Cited

OTHER PUBLICATIONS

Kim et al., A highly efficient self-power pack system integrating supercapacitors and photovoltaics with an area-saving monolithic architecture, J. Mater. Chem. A, 2017, 5, 1906 (Year: 2017).*

Liang et al., Integrated perovskite solar capacitors with high energy conversion efficiency and fast photocharging rate, J. Mater. Chem. A, 2018, 6, 2047 (Year: 2018).*

Huang, Flexible Perovskite Hybrid Solar Cells Through Organic Salt Treated Conducting Polymer as the Transparent Electrode, Thesis Apr. 2018 (Year: 2018).*

Chen et al., Efficient and Reproducible Monolithic Perovskite/Organic Tandem Solar Cells with Low-Loss Interconnecting Layers, Joule 4, 1594-1606, Jul. 2020 (Year: 2020).*

Zhu et al., Functionality of Non-Fullerene Electron Acceptors in Ternary Organic Solar Cells, Solar Rrl 3.12 Aug. 2019, 1900322 (Year: 2019).*

Fu et al., Recent Progress on the Long-Term Stability of Perovskite Solar Cells, Adv. Sci. 2018, 5, 1700387 (Year: 2018).*

Balamuralitharan et al., Hybrid reduced graphene oxide/MnSe2 cubes: a new electrode material for supercapacitors, Energy Technology 5.11 (2017): 1953-1962 (Year: 2017).*

CN-110698516-A English machine translation (Year: 2020).*

Zhu et al., Wireless portable light-weight self-charging power packs by perovskite-organic tandem solar cells integrated with solid-state asymmetric supercapacitors, Nano Energy 78 (2020): 105397. (Year: 2020).*

* cited by examiner

SOLAR CELLS, SOLID-STATE SUPERCAPACITORS, AND WIRELESS SELF-CHARGING POWER PACKS FORMED THEREWITH USING CONDUCTIVE THIN FILMS

CROSS-REFERENCE TO RELATED APPLICATIONS

The present application claims the benefit of U.S. Provisional Patent Application No. 63/086,376, filed Oct. 1, 2020.

FIELD OF THE INVENTION

The present invention relates to tandem solar cells and to solid-state solid-state supercapacitors and to self-charging power packs of tandem solar cells integrated with solid-state asymmetric solid-state supercapacitors.

BACKGROUND OF THE INVENTION

Self-charging power packs are a new type of electronic device operating through stored energy generated from multifarious forms of energy such as light, sound, and heat. With uninterrupted power supply, one can greatly extend the lifetime of electronics, and thus the self-charging power packs have beneficial application in the new generation of micro-systems including remote sensors, implantable biosensors and nano-robots. However, current self-charging power packs constrain the system performance and do not meet customers' satisfaction. The self-charging power packs charged by solar cells and driven by solid-state supercapacitors incorporated with liquid electrolytes have been reported. For example, Peng et al. developed flexible energy fiber by integrating polymer solar cells with solid-state supercapacitors, which exhibited superior flexibility but a lower overall efficiency of 0.82%. Recently, high-performance and stable solar flow battery devices were generated from perovskite/silicon tandem solar cells and redox flow batteries based on bis-(trimethylammonio)propylbviologen (BTMAP-Vi) and 4-trimethyl-ammonium-TEMPO (NMe-TEMPO) redox couples, such as those found in publication by Li, W., Zheng, J., Hu, B. et al. *High-performance solar flow battery powered by a perovskite/silicon tandem solar cell*. Nat. Mater. 19, 1326-1331 (2020), which is herein incorporated by reference. But tandem solar cells based on perovskite/silicon not only required cost-expensive manufacturing processes, but also had restricted compatibility with flexible and lightweight applications. In addition, the self-charging power packs employed metal wires to connect two different electronic devices, and this restricted their practical applications, in particular, in wearable and portable electronics as discussed in Pei Dong, Marco-Tulio F. Rodrigues, Jing Zhang, Raquel S. Borges, Kaushik Kalaga, Arava L. M. Reddy, Glaura G. Silva, Pulickel M. Ajayan, Jun Lou, *A flexible solar cell/supercapacitor integrated energy device*, Nano Energy, Volume 42, 2017, Pages 181-186, Du, P., Hu, X., Yi, C., Liu, H. C., Liu, P., Zhang, H.-L. and Gong, X. (2015), *Self-Powered Electronics by Integration of Flexible Solid-State Graphene-Based Supercapacitors with High Performance Perovskite Hybrid Solar Cells*. Adv. Funct. Mater., 25: 2420-2427, Zhang, Z., Chen, X., Chen, P., Guan, G., Qiu, L., Lin, H., Yang, Z., Bai, W., Luo, Y. and Peng, H. (2014), *Integrated Polymer Solar Cell and Electrochemical Supercapacitor in a Flexible and Stable Fiber Format*. Adv. Mater., 26: 466-470, and Xiaobao Xu, Shaohui Li, Hua Zhang, Yan Shen, Shaik M. Zakeeruddin, Michael Graetzel, Yi-Bing Cheng, and Mingkui Wang, *A Power Pack Based on Organometallic Perovskite Solar Cell and Supercapacitor*, ACS Nano 2015 9 (2), 1782-1787, which are herein incorporated by reference.

Thus, there is still a need in the art for wireless self-charging power packs based on solution processed solar cells and solid-state supercapacitors.

In solar cell technology, organic solar cells (OSCs) and perovskite solar cells (PSCs) have attracted great attention in both academic and industrial sectors due to their light weight and cost-effective manufacturing processes. Single junction PSCs with over 25.2% power conversion efficiencies (PCEs) and single junction OSCs with over 18% PCEs have been reported, but the open-circuit voltages (VOC) observed from both single junction PSCs and OSCs were too small to be used for the operation of most electronics. In order to enlarge VOC and thus PCEs, tandem solar cells have been developed. In the past years, the overwhelming majority of developments in tandem solar cells has been focused on PSCs combined with either copper-indium-gallium-diselenide (CIGS) solar cells or silicon solar cells. Tandem solar cells of PSCs with OSCs possess great advantages since both of them share the same device structures and can be fabricated by a cost-effective solution processed method. However, the PSCs-OSCs tandem solar cells to date exhibit poor device performance as compared with either PSCs-CIGS or PSCs-Si tandem solar cells.

Solid-state supercapacitors have been used as energy storage devices in self-charging power packs due to their fast charge and discharge times, high power density, and excellent electrochemical stability. These solid-state supercapacitors, however, used liquid electrolytes and exhibited low energy density, limiting their practical applications. Thus, there is a need in the art for solid-state supercapacitors that exhibit high energy densities suitable for practical applications.

Pseudocapacitive electrodes and asymmetric device structures have been developed to boost the energy density of solid-state supercapacitors. Compared to both transition metal oxides and transition metal sulfides, transition metal selenides possess higher electrical conductivities, which make them as potential materials for the positive electrodes in solid-state supercapacitors. Polyaniline (PANI) was widely developed pseudocapacitive material since it provided large pseudocapacitance and good flexibility.

With this background, the present invention improves the art by providing wireless self-charging power packs based on all-solution processed tandem solar cells of PSC and OSC integrated with asymmetric solid-state supercapacitors.

SUMMARY OF THE INVENTION

An embodiment of the present invention provides a wireless self-charging power pack comprising a solution processed conductive thin film integrating a solar cell with a solid-state supercapacitor.

Another embodiment of the present invention provides a wireless self-charging power pack as in any embodiment above, wherein the conductive thin film has an electrical conductivity of 1000 S/cm or greater.

Another embodiment of the present invention provides a wireless self-charging power pack as in any embodiment above, wherein the conductive thin film is selected from metal oxide thin films, conductive metal pastes, and polymeric thin films.

Another embodiment of the present invention provides a wireless self-charging power pack as in any embodiment above, wherein the conductive thin film is a polymeric thin film including a conductive organic material treated with an organic additive.

Another embodiment of the present invention provides a wireless self-charging power pack as in any embodiment above, wherein the conductive organic material is PEDOT:PSS and the organic additive is formamidinium iodide.

Another embodiment of the present invention provides a wireless self-charging power pack as in any embodiment above, wherein the solar cell includes a single-junction or a multi junction solar cell, and wherein the multi junction solar cell includes at least two solar cells, wherein the at least two solar cells may be different types of solar cells.

Another embodiment of the present invention provides a wireless self-charging power pack as in any embodiment above, wherein the solar cell is wherein the solar cell is a tandem solar cell comprising a ternary organic solar cell and a perovskite solar cell wherein the ternary organic solar cell and the perovskite solar cell are connected via shared intermediate layers, wherein the ternary organic solar cell includes an electrode cover layer, an electron extraction layer, a ternary organic photoactive layer, the shared intermediate layers; and wherein the perovskite solar cell includes the shared intermediate layers, a perovskite photoactive layer, a hole extraction layer, and an electrode layer.

Another embodiment of the present invention provides a wireless self-charging power pack as in any embodiment above, wherein the shared intermediate layers comprise an M-PEDOT:PSS layer, an SnO2 layer, and a PFN-OX layer, wherein the M-PEDOT:PSS layer is located adjacent to the ternary organic photoactive layer, wherein the SnO2 layer is located adjacent to the M-PEDOT:PSS layer, and wherein the PFN-OX layer is located adjacent to the SnO2 layer.

Another embodiment of the present invention provides a wireless self-charging power pack as in any embodiment above, wherein the electron extraction layer includes zinc oxide, wherein the ternary organic photoactive layer includes PTB7-DT, PC71BM, and O6T-4F, in the form of a bulk heterojunction, wherein the perovskite photoactive layer is CH3NH3PbI3, wherein the hole extraction layer is spiro-OMeTAD, and wherein the electrode layer is Ag, silver.

Another embodiment of the present invention provides a wireless self-charging power pack as in any embodiment above, wherein the solid-state supercapacitor includes a first electrode, a second electrode, and a solid-state electrolyte.

Another embodiment of the present invention provides a wireless self-charging power pack as in any embodiment above, wherein the first electrode includes a conductive polymer and a metal in the form of a composite.

Another embodiment of the present invention provides a wireless self-charging power pack as in any embodiment above, wherein the composite includes a polyaniline and MnSe2 composite disposed on carbon cloth, wherein the polyaniline and MnSe2 composite is polyaniline mixed with MnSe2 nanoparticles, and wherein a ratio of polyaniline to MnSe2 nano particles is from 1:1 to 75:1.

Another embodiment of the present invention provides a wireless self-charging power pack as in any embodiment above, wherein the second electrode includes 2-dimensional materials disposed on carbon cloth.

Another embodiment of the present invention provides a wireless self-charging power pack as in any embodiment above, wherein the second electrode includes a reduced graphene oxide disposed on carbon cloth.

Another embodiment of the present invention provides a wireless self-charging power pack as in any embodiment above, wherein the solid-state electrolyte includes a polymer gel.

Another embodiment of the present invention provides a wireless self-charging power pack as in any embodiment above, wherein the polymer gel includes PVA:H2SO4 gel.

An embodiment of the present invention provides a method of forming a wireless self-charging power pack comprising integrating a solar cell with a solid-state supercapacitor by forming a layer of conductive thin film between the solar cell and the solid-state supercapacitor through solution processing of the material forming the conductive thin film.

Another embodiment of the present invention provides method of forming a wireless self-charging power pack as in any embodiment above, wherein the solar cell includes an electrode and the layer of conductive thin film is formed directly on the electrode through solution processing.

Another embodiment of the present invention provides method of forming a wireless self-charging power pack as in any embodiment above, wherein the solution processing includes printing techniques for making wet thin films.

Another embodiment of the present invention provides method of forming a wireless self-charging power pack as in any embodiment above, wherein the printing techniques include spin coating, dip coating, slot-die coating, doctor blading, bar coating and 3D printing.

Another embodiment of the present invention provides method of forming a wireless self-charging power pack as in any embodiment above, wherein prior to the step of integrating a solar cell with a supercapacitor, the method further includes forming a solar cell, wherein the layers of the solar cell are formed by solution processing.

Another embodiment of the present invention provides method of forming a wireless self-charging power pack as in any embodiment above, wherein the step of forming a solar cell further includes forming a tandem solar cell by forming a ternary organic solar cell, then forming intermediate layers, then forming a perovskite solar cell with an electrode.

Another embodiment of the present invention provides method of forming a wireless self-charging power pack as in any embodiment above, wherein the solid-state supercapacitor is a solid-state supercapacitor formed by assembling a first electrode, a solid-state electrolyte, and a second electrode in a sandwich-type construction.

Another embodiment of the present invention provides method of forming a wireless self-charging power pack as in any embodiment above, wherein the first electrode includes a conductive polymer and metal composite disposed on carbon cloth, and wherein the second electrode includes 2-dimensional materials disposed on carbon cloth.

DETAILED DESCRIPTION OF ILLUSTRATIVE EMBODIMENTS

In some embodiments, the present invention advantageously integrates solar cells with solid-state supercapacitors through a solution processed conductive thin film to provide a wireless self-charging power pack. In some embodiments, a novel tandem solar cell is provided, and, in other embodiments, a novel solid-state supercapacitor is provided. These novel tandem solar cells and solid-state supercapacitors are, however, not required for the practice of a novel power pack, though they are employed in particular embodiments, and shown particularly in the examples section herein.

Figure 1:
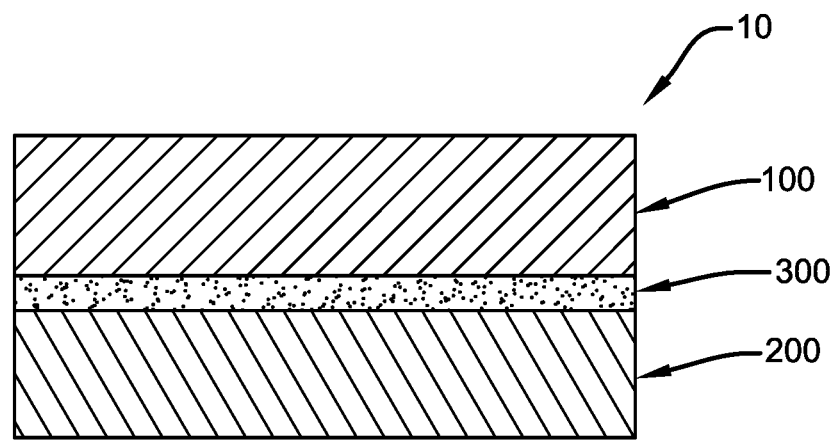
FIG. 1 is a schematic diagram of components of a wireless self-charging power pack.

Thus, turning to FIG. 1, a wireless self-charging power pack 10 includes a solar cell 100 integrated with a solid-state supercapacitor 200 through a solution processed conductive thin film 300. The solar cell 100 and solid-state supercapacitor 200 convert light to energy stored in the solid-state supercapacitor 200 to be usefully output to an external device.

In some embodiments, the conductive thin film has an electrical conductivity of 1000 S/cm or greater. In some embodiments, the conductive thin film is selected from metal oxide thin films, conductive metal pastes, and polymeric films.

In some embodiments, the metal oxide thin film is selected from those known in the art to have an electrical conductivity of 1000 S/cm or greater. In some embodiment, the conductive metal paste is selected from silver gold paste, AgAu paste. In some embodiments, the polymeric thin film is selected from PEDOT:PSS, polyaniline (PANI), PDA/PPY, and PTX.

In some embodiments, the polymeric thin film is a conductive organic material treated with an organic additive. In some embodiments, the conductive organic material is selected from PEDOT:PSS, polyaniline (PANI), PDA/PPY, and PTX. In some embodiments, the organic additive is selected from organic salts, including formamidinium iodide (FAI).

Advantageously, the conductive thin film can be formed as a solution processed layer on a layer of the solar cell or solid-state supercapacitor during the fabrication of the complete power pack. In some embodiments, every layer of the power pack is solution processed. Thus, in some embodiments, a solar cell is created by solution processing of each layer, and a solid-state supercapacitor is created by solution processing of each layer, and these are integrated by use of the conductive thin film, also solution processed. The examples section evidences this for a particular embodiment.

In some embodiments, the solar cell comprises an electrode and the layer of conductive thin film is formed directly on the electrode through solution processing, with the solid-state supercapacitor then assembled on the conductive thin film. In some embodiments, the layers of the solar cell are all solution processed.

In some embodiments, the conductive thin film is formed through a solution processing method selected from spin coating, dip coating, slot-die coating, doctor blading, bar coating, and 3D printing.

In some embodiments, virtually any solar cell can be employed to provide a power pack in accordance with this invention. In some embodiments the solar cells are single junction, and in other embodiments are multi-junction. In some embodiments the solar cells may be based on organic solar cells (OSCs), perovskite solar cells (PSCs), copper-indium-gallium-diselenide (CIGS) solar cells, and silicon solar cells. In some embodiments, and as particular shown in the examples section, the solar cell is a tandem solar cell, and particularly a tandem solar cell of a ternary organic solar cell and a perovskite solar cell.

Figure 2:
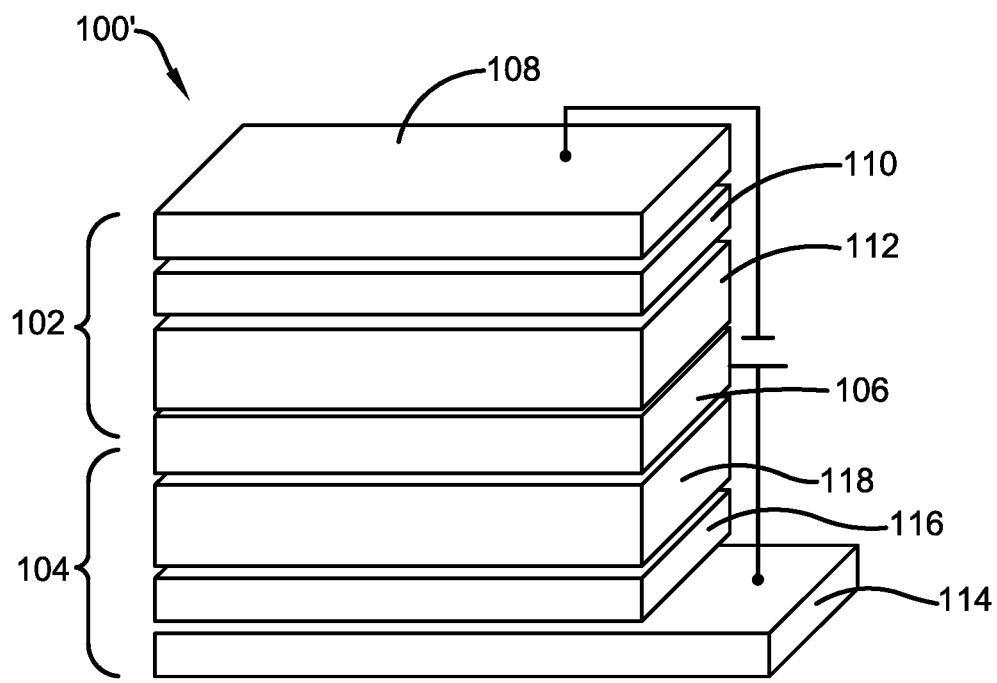
FIG. 2 is a schematic diagram of a tandem solar cell according to one embodiment of the present invention.
Figure 3:
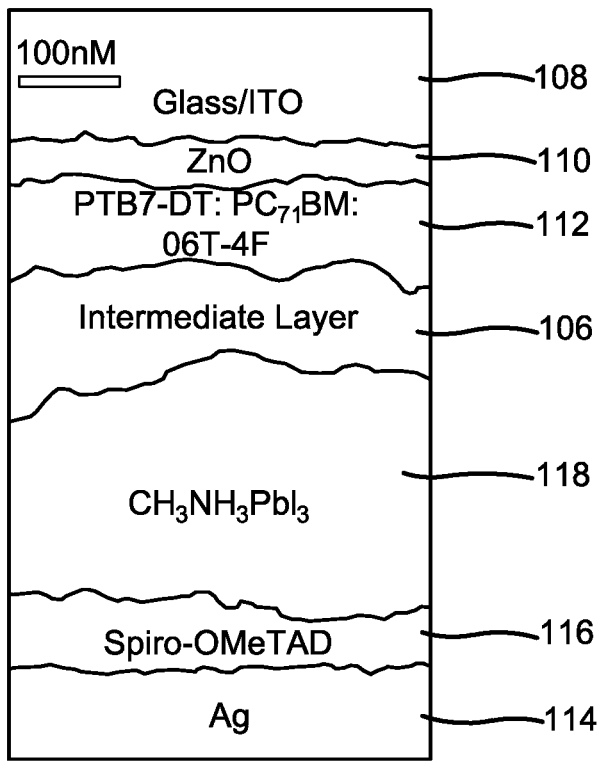
FIG. 3 is a representative view of an SEM image of a tandem solar cell according to one embodiment of the present invention.

FIG. 2 schematically displays the device architecture for tandem solar cells in accordance with this invention, and FIG. 3 is a representation of a cross-section SEM image of a tandem solar cell as produced per the experimental found herein below. In FIG. 2, the tandem solar cell 100' is a combination of a ternary OSC 102 integrated with a PSC 104 through solution-processed intermediate layers 106 that can be considered as part of both the OSC 102 and the PSC 104. In some embodiments, the ternary OSC is placed as the top sub-cell to catch the photons as much as possible, while the PSC is placed as the bottom sub-cell to harvest the photons passing through the ternary bulk heterojunction composite thin film of the OSC.

The OSC 102 includes a cathode cover layer 108, an electron extraction layer (EEL) 110, a ternary organic photoactive layer 112, and the intermediate layers 106.

The cathode cover layer 108 acts as the cathode and may be formed of any suitable material, such as indium-tin-oxide (ITO) coated on glass, for example. In some embodiments, the cover layer 108 is at least partially transparent to light.

The electron extraction layer 110 is a solution-processed layer of any suitable metal oxide material, such as ZnO or $TiO_x$, for example. In some embodiments, the electron extraction layer 110 is cast on the cathode cover layer 108 from an appropriate precursor solution (e.g. ZnO precursor solution), followed by thermal annealing. In some embodiments, the electron extraction layer 110 is at least partially transparent to light.

In some embodiments, the electron extraction layer has a thickness of from 25 to 50 nm. In some embodiments, the EEL precursor solution is chosen appropriately for solution processing of the chosen metal oxide. More particulars are provided in the experimental herein.

The ternary organic photoactive layer 112 is a solution processed bulk heterojunction (BHJ) active layer disposed on the electron extraction layer 110. The ternary organic photoactive layer 112 is solution-deposited on the ZnO layer from a corresponding ternary precursor solution. In some embodiments, the organic photoactive layer 112 is a ternary bulk heterojunction composite thin film of PTB7-DT:$PC_{71}$BM:O6T-4F formed by deposition of a thin film of a ternary precursor solution of O6T-4F, also known as COi8DFIC.

In some embodiments, the ternary organic photoactive layer 112 has a thickness of from 100 to 150 nm, in some embodiments, from 115 to 125 nm, and, in a particular embodiment, about 115 nm. The organic layer precursor solution is chosen appropriately for solution processing, and, in some embodiments, the solvents are selected from chlorobenzene, and other suitable solvents, and the ternary precursor solution has concentration of from 8 mg/mL to 12 mg/mL, in some embodiments, from 9 to 11 mg/mL, and in some embodiments about 10 mg/mL.

The intermediate layers 106 are formed from two or more materials suitably chosen to together serve as the anode for the ternary OSC and to serve as the cathode for the PSC. In some embodiments, the intermediate layers 106 are solution processed layers, and different solution processed intermediate layers are investigated to determine an optimum layer for a given OSC/PSC tandem solar cell. In some embodiments, the intermediate layers 106 are chosen from PEO-doped PEDOT:PSS, M-PEDOT:PSS, $SnO_2$, $TiO_x$, and PFN-OX.

In some embodiments, the intermediate layers 106 are M-PEDOT:PSS/$SnO_2$/PFN-OX, with each material (M-PEDOT:PSS; $SnO_2$; and PFN-OX) laid down separately from solution and annealed prior to laying down the next material, and wherein M-PEDOT is a modified PEDOT:PSS made from mixing a PEDOT:PSS solution with a PSS solution. In some embodiments, the PEDOT:PSS solution (SCA 388-20) is mixed with PSS solution (15 mb/mL in $H_2O$) at a ratio of 1:1.5. PEO-doped PEDOT:PSS is made by mixing PEDOT:PSS solution with a minor amount of PEO, in some embodiments 0.8 vol % PEO.

In a particular embodiment, M-PEDOT:PSS is solution coated onto the ternary organic photoreactive layer 112, and annealed, followed by solution coating and annealing of $SnO_2$, followed by solution coating and annealing of PFN-OX. In some embodiments $TiO_x$ precursor is employed instead of $SnO_2$.

In some embodiments, the intermediate layers 106 have a total thickness of from 60 nm to 120 nm, and, in some embodiments, from 70 nm to 80 nm, and, in some embodiments, is about 75 nm. In some embodiments employing M-PEDOT:PSS/$SnO_2$/PFN-OX, the M-PEDOT:PSS layer is from 25 to 50 nm thick, in some embodiments, from 35 to 45 nm, and in some embodiments is about 40 nm thick; the SnO2 layer is from 25 to 40 nm thick, in some embodiments, from 25 to 35 nm, and in some embodiments is about 30 nm thick; and the PFN-OX layer is from 2 to 10 nm thick, in some embodiments, from 4 to 6 nm, and in some embodiments is about 5 nm thick. A particular embodiment has M-PEDOT:PSS at 40 nm, SnO2 at 30 nm, and PFN-OX at 5 nm thick.

Each separate layer of the intermediate layers 106 is formed from a suitable precursor solution of suitable concentration, and each is solution processed through a solution process selected from selected form spin coating, dip coating, slot-die coating, doctor blading, bar coating, and 3D printing.

The PSC 104 includes the intermediate layers 106, an anode cover layer 114, a hole extraction layer (HEL) 116, and a perovskite photoactive layer 118.

In forming the tandem solar cell 100, a perovskite precursor solution is coated onto the intermediate layers 106, followed by annealing to form the perovskite photoactive layer 118, and then a HEL precursor solution is coated onto the perovskite layer 118 to form the hole extraction layer 116. Thereafter, the anode cover layer 114 can be deposited on the hole extraction layer 116. In the case of Ag, the anode cover layer 114 can be evaporated onto the hole extraction layer 116.

The perovskite photoactive layer 118 is a solution processed perovskite layer disposed on the hole extraction layer 116, and may comprise any suitable polymer composite material such as a material formed from a hybrid perovskite material defined by $ABX_3$, wherein A is selected from the group consisting of $CH_3NH_3^+$ or $NH_2CH=NH_2^+$, B is selected from the group consisting of $Pb^{2+}$ or $Sn^{2+}$, and X is a halide. In some embodiments, the perovskite photoactive layer 118 is $CH_3NHPbI_3$.

The hole extraction layer 116 is a solution-processed layer of any suitable material to serve as a hole extraction layer. Any hole extraction layer used for organic solar cell or perovskite solar cell is acceptable for use in the present invention. In particular embodiments of the present invention 2,2',7,7'-tetrakis[N,N-di(4-methoxyphenyl)amino]-9,9'-spirobifluorene (spiro-OMeTAD) is used for the hole extraction layer.

The HEL precursor solution is chosen appropriately for solution processing. For applying spiro-OMeTAD, the solution includes spiro-OMeTAD and tertabutly titanate (TBT) and bis(trifluoromethane)sulfonimide lithium salt (LiTFSI) in acetonitrile.

The anode cover layer 114 acts as the anode and may be formed of any suitable material, such as silver (Ag), for example. The Ag in some embodiments is about 100 nm.

In some embodiments, all of the layers except the cover layers 108 and 114, namely the electron extraction layer 110, the ternary organic photoactive layer 112, the intermediate layers 106, the perovskite photoactive layer 118, and the hole extraction layer 116, are all solution processed.

In a particular embodiment, the device configuration of ternary OSCs and PSCs is ITO/ZnO/PTB7-DT:$PC_{71}$BM:O6T-4F/intermediate layers, and intermediate layers/CH3NH3PbI3/spiro-OMeTAD/Ag, respectively, where ITO is indium tin oxide and acts as the cathode, solution-processed ZnO acts as the electron extraction layer (EEL), spiro-OMeTAD acts as the hole extraction layer (HEL), and Ag is sliver and acts as the anode, respectively. PTB7-DT:$PC_{71}$BM:O6T-4F ternary BHJ composite thin film is used as the photoactive layer for ternary OSCs and solution-processed $CH_3NHPbI_3$ is used as the photoactive layer for PSCs, respectively.

Figure 4:
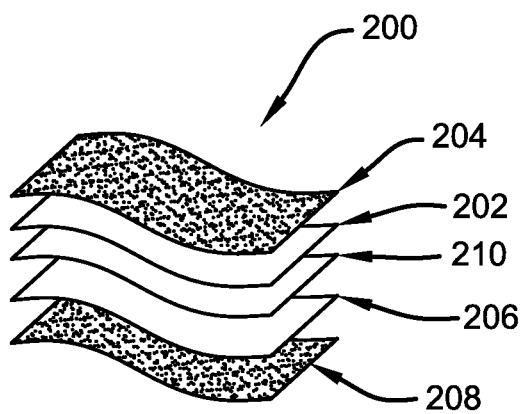
FIG. 4 is a schematic diagram of a solid-state supercapacitor according to one embodiment of the present invention.

The asymmetric solid-state supercapacitor is based on the use of PANI mixed with $MnSe_2$ nanoparticles to not only provide good flexibility, but also prevent the aggregate of $MnSe_2$ nanoparticles. FIG. 4 is a schematic display of the architecture of the asymmetric solid-state supercapacitor 200. The solid-state supercapacitor 200 includes a PANI:$MeSe_2$/CC electrode formed of a PANI/$MnSe_2$ composite 202 coated on carbon cloth 204. The solid-state supercapacitor also includes a reduced graphene oxide (rGO)/CC electrode formed of rGO 206 coated on carbon cloth 208. The rGO acts as a negative electrode. A PVA:$H_2SO_4$ gel electrolyte 210 is sandwiched between the electrodes to form an electrode/solid-state electrolyte/electrode construction. PANI:$MnSe_2$/CC, composites as the positive electrodes can provide both high pseudocapacitance and good flexibility. Reduced graphene oxides are chosen as the negative electrode owing to its high electrical conductivity, large surface area, good mechanical flexibility and excellent stability in various electrolytes. Further details are found in the Examples below.

A particular power pack, in some embodiments, has electrically conductive thin film fabricated from pristine PEDOT:PSS and coated onto the anode cover layer of a tandem solar cell and annealed to form a thin film that is then treated with an FAI solution (with DMF, EG, and GBL as non-limiting examples of suitable solvents). Excess FAI salt can be removed with DI water. Next, the PANI:$MnSe_2$/CC electrode (PANI/$MnSe_2$ composite coated on carbon cloth) is attached to the electrically conductive polymeric thin film, and the asymmetric solid-state supercapacitor structure is built up from the thin film.

In light of the foregoing, it should be appreciated that the present invention significantly advances the art by providing a wireless self-charging power pack that is structurally and functionally improved in a number of ways. While particular embodiments of the invention have been disclosed in detail herein, it should be appreciated that the invention is not limited thereto or thereby inasmuch as variations on the invention herein will be readily appreciated by those of ordinary skill in the art. The scope of the invention shall be appreciated from the claims that follow.

EXAMPLES

Fabrication and Characterization of Tandem Solar Cells

Materials

Poly[[4,8-bis[(5-ethylhexyl)thienyl]benzo [1,2-b, 3,3-b] dithiophene-2,6-diyl][3-fluoro-2-[(2-ethylhexyl) carbonyl] thieno [3,4-b] thiophenediyl]] (PTB7-DT) [6,6], -phenyl-C71-butyric acid methyl ester ($PC_{71}BM$) were purchased from 1-Materials Inc. O6T-4F (also known as $CO_i8DFIC$), was provided by Prof. Liming Ding's group [39]. Poly[9, 9-bis(6'-(N,N-diethylamino)propyl)-fluorene-alt-9,9-bis-(3-ethyl(oxetane-3-e-thyloxy)-hexyl)-fluorene] (PFN-OX) is synthesized based on the method reported in Hu, X., Yi, C., Wang, M., Hsu, Chih-Hao, Liu, S., Zhang, K., Zhong, C., Huang, F., Gong, X., Cao, Y. (2014). *High-Performance Inverted Organic Photovoltaics with Over 1-μm Thick Active Layers*. Adv. Energy Mater., 4: 1400378. which is herein incorporated by reference. Polyethylene oxide (PEO) (with molecular weight (Mw) of 500 g/mol) was purchased from Scientific Polymer Inc. Tin oxide (15% colloidal dispersion in water) and tin oxide nano-particle ink in butanol, and lead iodide ($PbI2$, 99.9985% metals basis) were purchased from Alfa Aesar. 2,2',7,7'-tetrakis[N,N-di(4-methoxyphenyl) amino]-9,9'-spirobifluorene (spiro-OMeTAD) (99%), tert-butylpyridine (98%), bis(trifluoromethane)sulfonimide lithium salt (LiTFSI) (99.95%), tetrabutyl titanate (TBT), acetonitrile (ACN, anhydrous, 99.8%), poly (sodium 4-styrenesulfonate) (PSS) solution, dimethylformamide (DMF, anhydrous, 99.8%), zinc acetate (99.99% trace metals basis), ethanol-amine (>>98%), chlorobenzene (CB) and 2-methoxyethanol (anhydrous, 99.8%) were purchased from Sigma-Aldrich. Methylammonium iodide (MAI, $CH_3NH_3I$) was purchased from Greatcell Solar. All materials were used as received without further processing.

Preparation and Characterization of Thin Films

The ZnO precursor solution was prepared by dissolving both of zinc acetate and ethanolamine in 2-methoxyethanol at a concentration of 0.5 mol $L^{-1}$. ZnO thin film (~40 nm) was spin-casted on the top of pre-cleaned ITO (indium tin oxides) glass from ZnO precursor solution. Spin-casting was followed with thermal annealing at 200° C. for 60 min (min). Afterward, the ZnO thin film was ultrasonicated in isopropyl alcohol and subsequently dried in an oven for further use.

The modified PEDOT:PSS (M-PEDOT:PSS) was made by mixing PEDOT:PSS solution (SCA 388-20) with additional PSS solution (15 mg/mL in $H_2O$). The volume ratio for the (PEDOT:PSS):PSS was 1:1.5. The resultant solutions were magnetically stirred for over 12 h for further applications. The PEO-doped PEDOT:PSS solution was prepared by mixing PEDOT:PSS solution with 0.8 vol % of PEO. The resultant solution was magnetically stirred for over 12 h for further use.

The PTB7-DT:O6T-4F:$PC_{71}BM$ bulk heterojunction (BHJ) thin film was solution-deposited on the top of the pre-cleaned substrates from 10 mg/mL CB solution, at 1500 rpm for 35 s (s).

The $CH_3NH_3PbI_3$ precursor solution (1.2 M) was prepared by mixing $PbI_2$ with MAI (1:1, molar ratio) in a mixed solvent of DMF with DMSO (4:1, volume ratio). The solution was spin-coated on the pre-cleaned substrates at 4000 rpm for 35 s (s). About 100 μL of toluene was poured on the thin film at 20 s to control the crystallization $CH_3NH_3PbI_3$ thin film. After that, $CH_3NH_3PbI_3$ thin films were post annealed at 100° C. for 10 min.

The absorption spectra of PTB7-DT:O6T-4F:$PC_{71}BM$ BHJ thin film and $CH_3NH_3PbI_3$ thin film were characterized with a Lambda 900 UV-vis-NIR spectrophotometer (PerkinElmer, Waltham, MA, USA). The field-emission scanning electron microscope (JEOL-7401) was applied to obtain the cross-section scanning electron microscopy (SEM) images.

The absorption of $CH_3NH_3PbI_3$ thin film ranges from 300 nm to 780 nm, whereas the absorption of PTB7-DT:O6T-4F:$PC_{71}BM$ ternary BHJ composite thin film ranges from 300 nm to 1100 nm. Thus, the combination of these two thin films covers spectral ranges from 300 nm to 1100 nm. Moreover, $CH_3NH_3PbI_3$ thin film could serve as a complementary absorber with respect to PTB7-DT:O6T-4F: $PC_{71}BM$ ternary BHJ composite thin film. Thus, tandem solar cells through the integration of ternary OSCs fabricated by PTB7-DT:O6T-4F:$PC_{71}BM$ ternary BHJ composite thin film, with PSCs fabricated by $CH_3NH_3PbI_3$ thin film could absorb light from 300 nm to 1100 nm, generating large short-circuit current (JSC) and producing large VOC as well if ternary OSCs and PSCs are connected in series.

Fabrication of Single-Junction Solar Cells—Ternary OSCs

The ternary OSCs were fabricated with a device architecture of ITO/ZnO/PTB7-DT:O6T-4F:$PC_{71}BM$/Al, where PTB7-DT is poly[[4,8-bis[(5-ethylhexyl)thienyl]benzo[1,2-b; 3,3-b]dithiophene-2,6-diyl][3-fluoro-2-[(2-ethylhexyl) carbonyl]thieno[3,4-b]thiophenediyl]], PCBM is [6,6]-phenyl-C71-butyric acid methyl ester and O6T-4F is also known as $CO_i8DFIC$. Pre-cleaned ITO glass substrates were firstly treated by UV/Ozone for 20 min in air. After that, 40 nm ZnO thin film was deposited on the top of the pre-cleaned ITO substrates from the ZnO precursor solution. The as-prepared ITO/ZnO was transferred into the glove box with a nitrogen atmosphere. The photoactive layer PTB7-DT: O6T-4F:$PC_{71}BM$ bulk heterojunction (BHJ) composite thin films were solution-deposited on the top of the ZnO thin layer from 10 mg/mL CB solution, at 1500 rpm for 35 s. Afterward, 100 nm Al was successively evaporated on the active layer in the vacuum system with a pressure of $6\times10^{-6}$ Pa. The effective device area was measured to be 0.045 $cm^2$.

Fabrication of Single-Junction Solar Cells—PSCs

The PSCs were fabricated with a device architecture of ITO/$SnO_2$/$CH_3NH_3PbI_3$/spiro-OMeTAD/Ag, where spiro-OMeTAD is 2,2',7,7'-tetrakis[N,N-di(4-methoxyphenyl) amino]-9,9'spirobifluorene. A thin layer of $SnO_2$ was spin-coated on the top of pre-cleaned ITO coated glass substrates with a spin speed of 4000 rpm for 30 s from $SnO_2$ water solution (15 wt %), followed with thermal annealing at 150° C. on the hotplate for 30 mins. After that, the ITO/$SnO_2$ thin films were immediately transferred into a glovebox with a nitrogen atmosphere. The $CH_3NH_3PbI_3$ thin films were deposited by the one-step processing method. Afterward, ~100 μL of toluene was poured on the thin film at 20 s. After that, $CH_3NH_3PbI_3$ thin films were post annealed at 100° C. for 10 min. The spiro-OMeTAD hole transport layer hole transport layer was formed by spin coating from the corresponding solution containing 80 mg/mL of spiro-OMeTAD and 30 μL/mL of tetrabutyl titanate (TBT), as well as 35 μL/mL of bis(trifluoromethane)sulfonimide lithium salt (LiTFSI) (260 mg/mL in acetonitrile, at 3000 rpm for 20 s on the top of $CH_3NH_3PbI_3$ thin films. Lastly, 100 nm Ag was successively evaporated on the spiro-OMeTAD layer in the vacuum system with a pressure of $6\times10^{-6}$ Pa. The effective device area was measured to be 0.045 $cm^2$.

Overall Structure

Tandem solar cells were fabricated with a device architecture of ITO/ZnO/PTB7-DT:PC$_{71}$BM:O6T-4F/intermediate layers/CH$_3$NH$_3$PbI$_3$/spiro-OMeTAD/Ag, where Ag is silver. The organic active layer, the PTB7-DT:PC$_{71}$BM: O6T-4F BHJ composite layer, was fabricated as disclosed below, but without Al electrode, where Al is aluminum. The optimization of the intermediate layers is addressed below. Subsequently, M-PEDOT:PSS (or PEO-doped PEDOT:PSS) was spin-coated on the top of the PTB7-DT: PC$_{71}$BM:O6T-4F BHJ composite layer, followed with thermal annealing at 105° C. for 10 min in the glovebox with nitrogen atmosphere. Then SnO$_2$ thin film was spin-coated on the top of M-PEDOT:PSS layer from SnO$_2$ solution, followed with thermal annealing at 105° C. for 10 min in the glovebox with nitrogen atmosphere. The PFN-OX thin layer was then spin-coated on the top of SnO$_2$ layer (or TiO$_x$ layer) from PFN-OX methanol solution, followed with thermal annealed at 105° C. for 5 min in the glovebox with nitrogen atmosphere. Afterward, CH$_3$NH$_3$PbI$_3$ with was deposited from the precursor solution by one-step method as described in the fabrication of PSCs. Approximately 100 µL of toluene was poured on the top of CH$_3$NH$_3$PbI$_3$ thin film for 20 s to control the crystallization of CH$_3$NH$_3$PbI$_3$ thin film, followed with post-annealing at 100° C. for 10 min. After that, an approximately 80 nm spiro-OMeTAD thin film was deposited on the top of CH$_3$NH$_3$PbI$_3$ thin film using the method described in the fabrication of PSCs, above. Finally, approximately 100 nm of Ag was successively evaporated on the top of spiro-OMeTAD layer in the vacuum system with a pressure of 6×10$^{-6}$ Pa. The effective device area was measured to be 0.045 cm$^2$.

The device configurations of ternary OSCs and PSCs are ITO/ZnO/PTB7-DT:O6T-4F:PC$_{71}$BM/intermediate layers, and intermediate layers/CH$_3$NH$_3$PbI$_3$/spiro-OMeTAD/Ag, respectively, where ITO is indium tin oxide and acts as the cathode, solution-processed ZnO acts as the electron extraction layer (EEL), spiro-OMeTAD acts as the hole extraction layer (HEL), and Ag is sliver and acts as the anode, respectively. Solution-processed PTB7-DT:O6T-4F: PC$_{71}$BM ternary BHJ composite thin film is used as the photoactive layer for ternary OSCs and solution-processed CH$_3$NH$_3$PbI$_3$ is used as the photoactive layer for PSCs, respectively. The intermediate layers act as the anode for ternary OSCs, and as the cathode for PSCs. Different solution-processed intermediate layers are investigated for the construction of tandem solar cells, as described above. After optimization, the multiple layer architecture of M-PEDOT:PSS/SnO$_2$/PFN-OX, are selected as the intermediate layers for construction of tandem solar cells. Since CH$_3$NH$_3$PbI$_3$ photoactive layer possesses relatively high absorption coefficient compared to PTB7-DT:O6T-4F:PC$_{71}$BM ternary BHJ composite photoactive layer, and the optimized thickness of PTB7-DT:O6T-4F:PC$_{71}$BM ternary BHJ composite photoactive layer is approximately 115 nm, which is thinner than the approximately 210 nm thickness of the CH$_3$NH$_3$PbI$_3$ photoactive layer. Thus, the Ternary OSCs are placed as the top sub-cell to catch the photons as much as possible, while PSCs are placed as the bottom sub-cell to harvest the photons that pass through top sub-cell. Such construction maximizes the photons that can efficiently absorbed resulting in high J$_{SC}$ from the tandem solar cells.

PTB7-DT:O6T-4F:PC$_{71}$BM ternary BHJ composite thin film and CH$_3$NH$_3$PbI$_3$ thin film are connected through solution-processed M-PEDOT:PSS/SnO2/PFN-OX intermediate layers. This architecture can be cost-effectively fabricated.

The LUMO energy levels of PTB7-DT (3.66 eV), O6T-4F (3.88 eV) and PC$_{71}$BM (4.00 eV) have a stepwise alignment, which is favorable for the separated electrons to be transported from the PTB7-DT electron donor to the O6T-4F electron acceptor and then to the PC$_{71}$BM electron acceptor, resulting in enhanced J$_{SC}$ for ternary OSCs. A small HOMO offset between CH$_3$NH$_3$PbI$_3$ (−5.45 eV) and the spiro-OMeTAD (5.20 eV) HEL could ensure the separated holes are efficiently transported, resulting in a large V$_{OC}$ for PSCs. The M-PEDOT:PSS layer with a deep work function (5.00 eV) collect the separated holes efficiently and sufficiently block the separated electrons from being transferred from PTB7-DT:PC$_{71}$BM: O6T-4F thin film to the SnO$_2$ EEL. A PFN-OX thin layer acts as the hole blocking layer and the EEL as well. The M-PEDOT:PSS/SnO$_2$/PFN-OX intermediate layers may boost the separated charge carriers to be efficiently transported, enhancing J$_{SC}$ for tandem solar cells.

Optimization of OSCs and PSCs Layers

Table 1, below, shows the performance of tandem solar cells with different thickness of the ternary organic layer. The device architecture is ITO/ZnO/PTB7-DT:PC$_{71}$BM:O6T-4F/intermediate layers/CH$_3$NH$_3$PbI$_3$/spiro-OMeTAD/Ag. The thickness of M-PEDOT:PSS is 40 nm, and the thickness of SnO$_2$ is 30 nm, the thickness of PFN-OX is 5 nm, and perovskite layer with a thickness of 210 nm. The device performance parameters are average values from over 20 identical devices.

TABLE 1

| Thickness of ternary organic layer (nm) | V$_{OC}$ (V) | J$_{SC}$ (mA/cm$^2$) | FF (%) | PCE (%) |
| --- | --- | --- | --- | --- |
| 125 | 1.60 | 14.36 | 67.5 | 15.50 |
| 120 | 1.62 | 14.75 | 67.8 | 16.20 |
| 115 | 1.62 | 14.81 | 68.1 | 16.33 |

Table 2, below, shows the performance of tandem solar cells with different thickness of the perovskite layer. The device architecture is ITO/ZnO/PTB7-DT:PC$_{71}$BM:O6T-4F/intermediate layers/CH$_3$NH$_3$PbI$_3$/spiro-OMeTAD/Ag. The thickness of M-PEDOT:PSS is 40 nm, and the thickness of SnO$_2$ is 30 nm, the thickness of PFN-OX is 5 nm, and organic layer with a thickness of 115 nm. The device performance parameters are average values from over 20 identical devices.

TABLE 2

| Thickness of provskite layer (nm) | V$_{OC}$ (V) | J$_{SC}$ (mA/cm$^2$) | FF (%) | PCE (%) |
| --- | --- | --- | --- | --- |
| 180 | 1.57 | 13.64 | 63.7 | 13.64 |
| 210 | 1.62 | 14.81 | 68.1 | 16.33 |
| 250 | 1.58 | 14.4 | 67.1 | 15.26 |

Based on the results shown in Table 1 and Table 2, the optimized thickness for ternary organic thin-film is 115 nm and CH$_3$NH$_3$PbI$_3$ thin film is 210 nm.

Optimization of Intermediate Layers

Tandem solar cells with a device architecture of ITO/ZnO/PTB7-DT:PC$_{71}$BM:O6T-4F/intermediate layers/CH$_3$NH$_3$PbI$_3$/spiro-OMeTAD/Ag were fabricated, where the thickness of the organic photoactive layer is 120 nm, and the thickness of the perovskite layer is 210 nm. The following intermediate layers were investigated:
Intermediate layer A: PEO-Doped PEDOT:PSS/TiO$_x$
Intermediate layer B: M-PEDOT:PSS/TiO$_x$
Intermediate layer C: M-PEDOT:PSS/TiO$_x$/PFN-OX
Intermediate layer D: PEO-Doped PEDOT:PSS/SnO$_2$
Intermediate layer E: M-PEDOT:PSS/SnO$_2$
Intermediate layer F: M-PEDOT:PSS/SnO$_2$/PFN-OX
A summary of the performance of devices with intermediate layers A-F is found in Table 3, below.

TABLE 3

| Intermediate Layers | $V_{OC}$ (V) | $J_{SC}$ (mA/cm$^2$) | FF (%) | PCE (%) |
|---|---|---|---|---|
| A | 1.08 | 3.90 | 34.90 | 1.47 |
| B | 1.22 | 3.67 | 35.30 | 1.58 |
| C | 1.39 | 3.48 | 49.50 | 2.40 |
| D | 1.46 | 8.58 | 50.70 | 6.36 |
| E | 1.54 | 11.60 | 59.00 | 10.53 |
| F | 1.60 | 13.89 | 68.00 | 15.10 |

Next, the thicknesses of the intermediate layers based on the architecture of Intermediate layer F, M-PEDOT:PSS/SnO$_2$/PFN-OX, was investigated. Table 4 includes the results of varying the thickness of M-PEDOT:PSS with a device architecture of ITO/ZnO/PTB7-DT:PC$_{71}$BM:O6T-4F/intermediate layers/CH$_3$NH$_3$PbI$_3$/spiro-OMeTAD/Ag. The thickness of SnO$_2$ is 35 nm and the thickness of PFN-OX is 5 nm. The device performance parameters are average values from over 20 identical devices.

TABLE 4

| Thickness of M-PEDOT:PSS (nm) | $V_{OC}$ (V) | $J_{SC}$ (mA/cm$^2$) | FF (%) | PCE (%) |
|---|---|---|---|---|
| 50 | 1.60 | 8.74 | 52.8 | 7.38 |
| 45 | 1.58 | 13.72 | 67.5 | 14.63 |
| 40 | 1.61 | 14.55 | 67.9 | 15.90 |
| 35 | 1.58 | 13.56 | 68.0 | 14.57 |

Table 5 includes the results of varying the thickness of SnO$_2$ with a device architecture of ITO/ZnO/PTB7-DT:PC$_{71}$BM:O6T-4F/intermediate layers/CH$_3$NH$_3$PbI$_3$/spiro-OMeTAD/Ag. The thickness of M-PEDOT:PSS is 40 nm and the thickness of PFN-OX is 5 nm. The device performance parameters are average values from over 20 identical devices.

TABLE 5

| Thickness of SnO$_2$ (nm) | $V_{OC}$ (V) | $J_{SC}$ (mA/cm$^2$) | FF (%) | PCE (%) |
|---|---|---|---|---|
| 40 | 1.55 | 8.92 | 52.9 | 7.31 |
| 35 | 1.61 | 14.55 | 67.9 | 15.90 |
| 30 | 1.62 | 14.75 | 67.8 | 16.20 |
| 25 | 1.59 | 13.74 | 68.0 | 14.85 |

Table 6 includes the results of varying the thickness of PFN-OX with a device architecture of ITO/ZnO/PTB7-DT:PC$_{71}$BM:O6T-4F/intermediate layers/CH$_3$NH$_3$PbI$_3$/spiro-OMeTAD/Ag. The thickness of M-PEDOT:PSS is 40 nm and the thickness of SnO$_2$ is 30 nm. The device performance parameters are average values from over 20 identical devices.

TABLE 6

| Thickness of PFN-OX (nm) | $V_{OC}$ (V) | $J_{SC}$ (mA/cm$^2$) | FF (%) | PCE (%) |
|---|---|---|---|---|
| 10 | 1.61 | 14.67 | 67.8 | 16.01 |
| 5 | 1.62 | 14.75 | 67.8 | 16.20 |
| 2 | 1.62 | 14.39 | 67.4 | 15.71 |

Thus, the optimized intermediate layer is of the architecture M-PEDOT:PSS/SnO$_2$/PFN-OX, where the thickness for M-PEDOT:PSS is 40 nm, the thickness for SnO$_2$ is 30 nm, and the thickness of PFN-OX is 5 nm.

Characterizations of Tandem Solar Cells

The device performance parameters of OSCs, PSCs, and tandem solar cells are summarized in Table 7, below. The average data was calculated from over 20 devices. The data presented in the parentheses are the best device performance parameters.

TABLE 7

| Solar Cells | $V_{OC}$ (V) | $J_{SC}$ (mA/cm$^2$) | FF (%) | PCE (%) |
|---|---|---|---|---|
| Ternary OSCs | 0.71 ± 0.02 (0.73) | 26.17 ± 1.04 (27.21) | 65.5 ± 0.03 (65.8) | 12.25 ± 0.82 (13.07) |
| PSCs | 1.05 ± 0.02 (1.07) | 20.55 ± 1.28 (21.83) | 67.1 ± 0.3 (67.4) | 14.34 ± 1.34 (15.68) |
| Tandem Solar Cells | 1.62 ± 0.02 (1.64) | 14.81 ± 0.52 (15.32) | 68.1 ± 0.2 (68.3) | 16.33 ± 0.83 (17.16) |

Device performance was investigated for tandem solar cells with different active areas. An increase in cell areas results in a slightly increased series resistance, which compromises the efficiency. However, it was found that the reduced PCEs is mainly originated from reduced fill factor (FF) rather than short-circuit current density ($J_{SC}$) and open circuit voltage ($V_{OC}$), which suggests that tandem solar cell can output a consistent photocurrent and voltage although active area is enlarged over 3 times. Thus, solid-state supercapacitor could be normally charged by tandem solar cell, regardless of cell area, is not an issue.

The ternary OSCs exhibit a $J_{SC}$ of 27.21 mA/cm2, a $V_{OC}$ of 0.73 V, a fill factor (FF) of 65.8%, and with a corresponding PCE of 13.07%. The PSCs exhibit a $J_{SC}$ of 21.83 mA/cm$^2$, a $V_{OC}$ of 1.07 V, an FF of 67.4%, and with a corresponding PCE of 15.68%. These device performance parameters are in good agreement with previously reported values. Tandem solar cells exhibit a JSC of 15.32 mA/cm2, a $V_{OC}$ of 1.64 V, an FF of 68.3%, with the corresponding PCE of 17.16%. A PCE of 17.16% is the highest value to be reported from tandem solar cells constructed by PSCs with OSCs. Most importantly, a $V_{OC}$ of 1.64 V obtained from tandem solar cells is close to the sum of $V_{OC}$ values of ternary OSCs (0.73 V) and PSCs (1.07 V), which indicates that solution-processed tandem solar cells constructed by PSCs with ternary OSCs are successfully demonstrated.

The current densities versus voltages (J-V) characteristics were obtained from a Keithley model 2400 source measurement. A Newport Air Mass 1.5 Global (AM1.5G) full-spectrum solar simulator was supplied as the light source. The external quantum efficiency (EQE) spectra of solar cells were performed using a solar cell quantum efficiency measurement system of European Solar Test Installation (ESTI). The transient photocurrent (TPC) measurement was performed through the home-made setup as disclosed in Xu, W., Zheng, L., Zhang, X., Cao, Y., Meng, T., Wu, D., Liu, L., Hu, W., Gong, X., *Efficient Perovskite Solar Cells Fabricated by Co Partially Substituted Hybrid Perovskite*, Adv. Energy Mater. 2018, 8, 1703178, which is herein incorporated by reference.

Absorption spectra of organic thin films and perovskite thin films were measured by a LAMBDA 750 UV/vislNIR spectrometer from PerkinElmer Company. SEM images were obtained by using a field emission scanning electron microscope (JEOL-7401). The J-V characteristics were obtained from a Keithley model 2400 source measurement. A Newport Air Mass 1.5 Global (AML5G) full-spectrum solar simulator was supplied as the light source. The external quantum efficiency (EQE) spectra of OSCs were performed using a solar cell quantum efficiency measurement system of European Solar Test Installation (ESTI). The transient photocurrent (TPC) measurement was performed through the home-made setup. W. Xu, 1. Zheng, X. Zhang, Y. Cao, T. Meng, D. Wu, 1. Liu, W. Hu and X. Gong, Adv. Energy Mater., 2018, 8, 1703178.

To obtain accurate photocurrent for the studied solar cells at a short time scale, the transient photocurrent (TPC) measurements were used to probe photogenerated charge carriers rather than just measuring the photocurrent or EQE. Based on the EQE spectra, the integrated current densities are calculated to be 22.96 mA/cm$^2$, 20.10 mA/cm$^2$ and 13.90 mA/cm$^2$ for ternary OSCs, PSCs and tandem solar cells, respectively. All these values are in good agreement with those from the J-V characteristics. The charge carrier density collected at a wavelength of 590 nm for all studied solar cells was obtained. There are more than 52% and 36% charge carriers generated in ternary OSCs and PSCs compared to that of the tandem solar cell, respectively. These results are consistent with that from J-V characteristics. The charge carrier extraction times of ~76, ~58, and ~93 nanoseconds (ns) are observed from ternary OSCs, PSCs and tandem solar cells, respectively. The total extracted charge carrier densities from ternary OSCs, PSCs and tandem solar cells are further calculated by integration of the transient photocurrent density over the transient time. The extracted charge carrier densities for ternary OSCs, PSCs and tandem solar cells are 50.10 nC/cm$^2$, 64.77 nC/cm$^2$, and 31.34 nC/cm$^2$, respectively. As compared with tandem solar cells, more than 60% and 107% charge carriers are generated by ternary OSCs and PSCs, respectively.

The steady-state light intensity-dependent $V_{OC}$ for ternary OSCs, PSCs, and tandem solar cells were graphed. The relations between $V_{OC}$ and the light intensity were expressed as $V_{OC} \alpha \, Sln(l)$, where $S=kT/q=0.026$ (k is the Boltzmann's constant, T is the temperature, and q is the elementary charge at room temperature), and l is the light intensity. The S values are fitted to be 0.034, 0.032 and 0.046 for ternary OSCs, PSCs and tandem solar cells, respectively. A larger S was observed from tandem solar cells and indicates that the geminate recombination is responsible for small $J_{SC}$.

To understand the $V_{OC}$ losses in tandem solar cells, the J-V characteristics of an optimized solar cell measured with different incident light intensity were studied. A near-linear dependence of $J_{SC}$ with the light-intensity for ternary OSCs, PSCs, and tandem solar cells was observed. $J_{SC}$ dependence on the light intensity, which is described as $J_{SC} \alpha I^a$, where I is the light intensity and a is the coefficient.[5,6] All charge carriers are swept out before recombination as $\alpha=1$.[5,6] $\alpha$ of 0.94, 0.94 and 0.90 are observed from ternary OSCs, PSCs, and tandem solar cell, respectively. The lower a observed from tandem solar cell suggests that the bimolecular recombination is dominated in tandem solar cell, which can explain that the observed $V_{OC}$ (1.64 V) in tandem solar cells is lower than the theoretical number of 1.80 V (0.73 V+1.07 V). As α approximates to 1, which indicates that all charge carriers are swept out before recombination. A smaller a observed from tandem solar cells indicates that the non-geminate recombination is dominated in tandem solar cells. As a result, α reduced $J_{SC}$ is observed from tandem solar cells.

Theoretically, a $V_{OC}$ from tandem solar cells should be a sum of $V_{OC}$ values of ternary OSCs and PSCs, since ternary OSCs is connected in series with PSCs. However, a $V_{OC}$ of 1.64 V obtained from tandem solar cells is smaller than the sum of $V_{OC}$ values (1.80 V) from ternary OSCs (0.73 V) and PSCs (1.07 V). Such voltage loss is attributed to poor electrical conductivity of the M-PEDOT:PSS/SnO$_2$/PFN-OX intermediate layers. The SnO$_2$ EEL with PFN-OX interfacial layer can ensure ternary OSCs to be connected in series with PSCs and provide a strong dipole between the SnO$_2$ EEL and CH$_3$NH$_3$PbI$_3$ thin film, resulting in electron extraction from CH$_3$NH$_3$PbI$_3$ thin film. The SnO$_2$ EEL with a deep LUMO energy level inevitably restricts the separated electrons to be efficiently transported from CH$_3$NH$_3$PbI$_3$ thin film. Even though such electron transporting barrier is compromised by the dipole induced by the PFN-OX thin layer, the poor electrical conductivity of solution-processed SnO$_2$ EEL still impedes the separated electrons to be efficiently transported. As a result, a voltage loss occurs in tandem solar cells. But nevertheless, a VOC observed from tandem solar cells is close to the sum of VOC values of ternary OSCs and PSCs indicates that solution-processed tandem solar cells constructed by ternary OSCs with PSCs are successfully demonstrated.

Solution-processed tandem solar cells exhibit a working voltage of 1.64 V, which is larger than 1.50 V, a typical voltage used for most commercial electronics. Thus, above solution-processed tandem solar cells are capable as a renewable energy source in self-charging power packs.

The operational stability of tandem solar cells was investigated. The results showed that tandem solar cells retains-90% of their original PCEs after continuous white light illumination for 1800 seconds (s), which is longer than the time (~180 s) for solid-state supercapacitors to be charged by the tandem solar cells. These results indicate that a continuous light soaking upon tandem solar cells has a minor influence on the charging process of final self-charging power packs. However, tandem solar cells show a slight drop in PCEs and $J_{SC}$ over time. Such behaviors are probably ascribed to the instability of both organic and perovskite active layers.

Fabrication and Characterization of Solid-State ASCs
Preparation of Negative Electrode Graphene oxide (GO) was prepared by an improved Hummers' method. Firstly, graphite powder (3.0 g), 98% H$_2$SO$_4$, K$_2$S$_2$O$_8$ (2.5 g) and P$_2$O$_5$ (2.5 g) were mixed in a flask and stirred at 80° C. for 6 hours (hrs). After cooling down the mixture to room temperature, cold 98% H$_2$SO$_4$ (120 mL, 0° C.) was added into the above mixture. Then, KMnO$_4$ (15 g) was slowly added into the mixture at 35° C. After that, H$_2$O$_2$ (20 mL, 30%) was added into the above mixture, centrifuged and washed with 1 M HCl and deionized (DI) water until pH=6-7 to obtain GO solution. Afterward, 20 μL hydrazine hydrates (N$_2$H$_2$.H$_2$O) were added into 10 mL GO solution (2.2 mg/mL). The mixture was heated in an autoclave at 60° C. for 6 hrs. Finally, rGO was dried in an oven at 60° C. for 12 hrs. To prepare the rGO/CC electrodes, the rGO were blended with carbon black and polyvinylidene difluoride in a weight ratio of 8:1:1 in 1-methyl-2-pyrrolidone. Then the slurry containing active materials, carbon black and polyvinylidene difluoride was coated on the carbon cloth (1 cm×1 cm) and dried at 60° C. for 12 hrs.

Solid-state ASCs with rGO as the negative electrode are known to exhibit high capacitance, which was ascribed to rGO's large surface area, high electrical conductivity and abundant open channels for ionic transporting. Thus, rGO coated on the CC substrate is used as the negative electrode to enhance the flexibility of the rGO electrode since the CC substrate is highly flexible and a good electrical conductor. Preparation and Characterization of PANI:MnSe2/CC, the PANI/CC, and the MnSe2/CC Electrodes Materials Potassium peroxydisulfate ($K_2S_2O_8$), phosphorus pentoxide ($P_2O_5$), $H_2SO_4$ (95-98%), $H_3PO_4$ (85%), $H_2O_2$ (30%), ethanol and diethyl ether were purchased from Alfa Aesar. Carbon cloth (0.5 mm thickness) was purchased from Fuel Cells Earth. Manganese sulfate monohydrate ($MnSO_4 \cdot H_2O$), sodium selenite ($Na_2SeO_3$), hydrazine hydrate ($N_2H_4 \cdot H_2O$, 78-82%), aniline, ammonium persulfate (($NH_4)_2S_2O_4$), aniline, graphite powder, and potassium permanganate ($KMnO_4$) were purchased from Sigma-Aldrich. All materials are used as received without further purification.

$MnSe_2$ particles were synthesized by the method reported in the literature. $MnSO_4 \cdot H_2O$ (1.00717 g, 0.00667 mol) was solved in 40 mL DI water. Then $Na_2SeO_3$ (0.573 g) mixed hydrazine hydrate ($N_2H_4 \cdot H_2O$, 6.67 mL) solution was added into $MnSO_4$ solution after stirring 5 minutes (mins) and then transferred above mixed solution into the autoclave. The autoclave was sealed and heated in an oven at 100° C. for 24 hours (hrs). Afterward, the autoclave was cooled down to room temperature naturally. 100 mL of hydrochloric acid (1M) was added into the above mixed solution under continually stirring. The product, black precipitation, was generated. The final sample was produced after pro-product was centrifuged several times by DI water and then ethanol, and dried in an oven at 60° C. for 12 hrs.

Firstly, 200 mL sulfuric acid (1M) was dropped into 0.05 mol (4.5 mL) aniline in ice-bath and then stirred for 2 hrs. Afterward, $MnSe_2$ with 50 mL (0.04 mol, 9.128 g) ($NH_4$)$_2S_2O_8$ solution was added into above solution (with the molar ratios of PANI:$MnSe_2$ to be 1:1, 25:1, 50:1 and 75:1, respectively) under continuously stirring for 4 hrs. The final sample, PANI:$MnSe_2$ composite with green color was produced after the precipitation was centrifuged and washed by DI water, and then dried in over at 60° C. for 12 hrs.
Characterization of the PANI:MnSe2 Composites, PANI, and MnSe2

Scanning electron microscopy (SEM) images of samples were conducted on JEOL-7401. X-ray diffraction (XRD) patterns were performed on Bruker AXS Dimension D8, Germany. The cycling voltammetry (CV), galvanostatic charge-discharge (GCD) measurements were performed on Gamry reference 3000 electrochemical workstations (Gamry Instruments, U.S.A), in the range of −0.5V to 0.8V in the three-electrode system and the two-electrode configurations, respectively. The electrochemical impedance spectroscopy (EIS) is measured in a two-electrode configuration using a Gamry reference 3000 electrochemical workstations (Gamry Instruments, U. S.A). EIS measurements were performed with the frequency ranging from 10 mHz to 100 kHz and an impedance amplitude of ±5 mV at open circuit potential. The cycle-life stability was performed using computer controlled cycling equipment (LAND CT2001A, Wuhan China).

The crystalline phases of the materials were measured by XRD. It can be confirmed that $MnSe_2$ has a highly crystalline form that resembles an NaCl structure. Compared with standard reference data, the characteristic peaks of $MnSe_2$ are 2θ=24.079°, 27.870°, 31.225°, 34.285°, 39.764°, 42.311°, 46.970°, 49.188°, 51.330°, 53.422°, 57.421°, 59.363°, 63.12°, 66.754°, 68.580°, corresponding to the (111), (200), (210), (211), (220), (221), (222), (230), (311), (321), (331), (332), (400), (410), (420), (421) planes, respectively, can be observed as well. These peaks show that $MnSe_2$ synthesized has good crystallinity. Moreover, compared with standard XRD pattern of $MnSe_2$, it can be noticed that $MnSe_2$ synthesized is of sufficient purity.

The XRD pattern proves that the obtained PANI is a semi-crystalline material. The typical amorphous scattering of PANI in the emeraldine base (EB) form can be observed as one broad peak around 2θ of approximately 21° and a narrow peak at 2θ of 25.51° indicates that PANI forms a crystalline structure. Some small narrow peaks and a broad one can be detected, indicating composite material also has a semi-crystal structure. By comparing the XRD pattern of PANI with that of composite it is confirmed that the main component of the composite is PANI.

The comparison of morphology and microstructure of the $MnSe_2$, PANI, and composite were characterized by scanning electron microscope (SEM). SEM confirmed that $MnSe_2$ has a structure of a microcube which can reinforce the result obtained from XRD measurement that $MnSe_2$ has good crystallinity. The surface of the $MnSe_2$ cubes are uneven and have a rough structure which increases the ability to absorb a larger number of ions and electrons. PANI also has a large surface area due to its cavernous structure and the uneven surface which explains the large capacitance of PANI. SEM images of the PANI/MnSe2 composite reveal that the composite has a cavernous structure like pure PANI in its overall structure. Higher resolution microscopy reveals that PANI sticks on the surface of $MnSe_2$ and then develops outwards. This structure leads PANI/$MnSe_2$ composites to have the advantages of both of the pure forms of $MnSe_2$ and PANI. It has a large surface area ensuring the large capacitance, a porous structure providing high conductivity. Moreover, the $MnSe_2$ cubes are not found in isolation in the SEM images of composite material. Thus, there is a great connection between PANI and $MnSe_2$, wherein PANI completely envelopes the $MnSe_2$.
Preparation of the PANI:MnSe2/CC, the PANI/CC, and the MnSe2/CC Electrodes To prepare the PANI/CC electrodes, PANI was blended with carbon black and polyvinylidene difluoride in a weight ratio of 8:1:1 in 1-methyl-2-pyrrolidone. Then the slurry containing PANI, carbon black and polyvinylidene difluoride was coated on the carbon cloth (1 cm×1 cm). Finally, the electrode was dried at 60° C. for 12 hrs. The PANI/CC electrode was then fabricated.

To prepare the MnSe2/CC electrodes, $MnSe_2$ was blended with carbon black and polyvinylidene difluoride in a weight ratio of 8:1:1 in 1-methyl-2-pyrrolidone. Then the slurry containing $MnSe_2$, carbon black and polyvinylidene difluoride was coated on the carbon cloth (1 cm×1 cm). Finally, the electrode was dried at 60° C. for 12 hrs. The $MnSe_2$/CC electrode was then fabricated.

To prepare the PANI:$MnSe_2$/CC electrodes, PANI:$MnSe_2$ was blended with carbon black and polyvinylidene difluoride in a weight ratio of 8:1:1 in 1-methyl-2-pyrrolidone.

Then the slurry containing PANI:MnSe$_2$, carbon black and polyvinylidene difluoride was coated on the carbon cloth (1 cm×1 cm). Finally, the electrode was dried at 60° C. for 12 hrs. The PANI:MnSe$_2$/CC electrode was then fabricated.

Characterization of the PANI:MnSe2/CC, the PANI/CC, and the MnSe2/CC Electrodes

The CV and the GCD measurements were performed on Gamry reference 3000 electrochemical workstations (Gamry Instruments, U.S.A), in a three-electrode configuration using platinum wire and saturated calomel electrode (SCE) as the counter electrode and reference electrode, respectively. The electrochemical impedance spectroscopy (EIS) is measured in the same three-electrode configuration using a Gamry reference 3000 electrochemical workstations (Gamry Instruments, U.S.A). The EIS measurements were performed with the frequency ranging from 10 mHz to 100 kHz and an impedance amplitude of ±5 mV at an open circuit potential.

The EIS of the PANI:MnSe$_2$/CC, the PANI/CC and the MnSe$_2$/CC electrodes were plotted. The longest Warburg line was observed from the PANI:MnSe$_2$/CC electrode, which indicates a better ionic diffusion into the PANI:MnSe$_2$/CC electrode as compared with either the PANI/CC or the MnSe$_2$/CC electrodes. In the low frequency region, the linear part of the PANI:MnSe$_2$/CC electrode showed the largest slope, which indicates a better capacitive behavior of the PANI:MnSe$_2$/CC electrode.

The electrochemical properties of PANI:MnSe$_2$/CC electrode are firstly investigated with a three electrode system in 1 M H$_2$SO$_4$ aqueous electrolyte by cyclic voltammetry (CV) and galvanostatic charge/discharge (GCD), respectively. All composite material electrodes exhibit a pair of redox peaks which could be expressed from MnSe$_2$ and PANI, manifesting the composite have a way to store the energy by the redox reaction. The corresponding reversible redox reaction of MnSe$_2$ can be shown as:

(1)

(2)

The above reaction reveals the intercalation of H$^+$ into or out of the PANI:MnSe$_2$/CC electrode during the reduction and oxidation process. The absorption and desorption of H$^+$ on the interface of MnSe$_2$ and electrolyte solution are taken place during charge and discharge processes. Moreover, PANI has three different oxidation states: the fully reduced leucoemeraldine (LE) (y=1), the half oxidized emeraldine base (EB) (y=0.5) and the fully oxidized pemigraniline (PE) (y=0). The redox reactions between these different oxidation states will also provide large pseudocapacitance.

In addition, it was found that as the molar ratios of PANI:MnSe$_2$ increasing, the CV curve area of the PANI:MnSe$_2$/CC electrodes first increased and then decreased. The PANI:MnSe$_2$/CC electrode prepared with a molar ratio as 50:1 (PANI:MnSe$_2$) has the largest CV curve area, revealing the largest specific capacitance among the series of PANI:MnSe$_2$/CC electrodes. The GCD curves of the PANI:MnSe$_2$/CC electrodes further confirm that the PANI:MnSe$_2$ composites with the molar ratio as 50:1 (PANI:MnSe$_2$) have the longest discharge time, reflecting the largest specific capacitance at the current density of 1 A/g.

The results of specific capacitance by calculated are summarized in Table 8, below which also reveals that the PANI/MnSe$_2$ composite material with the molar ratio as 50:1 (PANT:MnSe$_2$) has the largest capacitance.

TABLE 8

| | PANI:MnSe$_2$ (1:1) | PANI:MnSe$_2$ (25:1) | PANI:MnSe$_2$ (50:1) | PANI:MnSe$_2$ (75:1) |
|---|---|---|---|---|
| Specific Capacitance (F/g) | 337 | 444 | 850 | 333 |

Electrochemical impedance spectroscopy was performed to analyze the resistance and capacity ability of the PANI/MnSe$_2$ composite electrode. In the high-frequency region, the PANI/MnSe$_2$ composite electrodes exhibit a semicircle, indicating a great ionic contact between the electrode and electrolyte and good ionic conductivity of the electrode-electrolyte system. Moreover, the vertical lines along y-axis demonstrate the great energy storage behaviors of the PANI/MnSe$_2$ electrodes in the low-frequency region. The ionic resistance of the electrolyte, intrinsic resistance of substrate and the contact resistance on the interface of electrodes and the current collectors are generally considered as serial resistance ($R_S$), which is estimated by the intersection of the real axis and the lines. The $R_S$ of all the PANI/MnSe$_2$ composite electrodes is almost similar. All these results reveal that the PANI/MnSe$_2$ composite with the molar ratio as 50:1 is the best candidate for electrochemical storage.

Fabrication of the Solid-State ASCs

Fabrication of the solid-state ASCs: The CC/PANI:MnSe$_2$//PVA: H$_2$SO$_4$//rGO/CC solid-state ASCs were fabricated by assembling the PANI:MnSe$_2$/CC electrode, where CC is carbon cloth, the rGO is reduced graphene oxide, which acts as negative electrode, and PVA:H$_2$SO$_4$ gel electrolyte into a sandwich-type cells construction (electrode/solid-state electrolyte/electrode). Finally, the cells were packaged using PET film.

The solid-state ASCs maintain ~78% of its initial specific capacitance after 2000 cycles. However, a slight reduction in the specific capacitance after 1500 cycles was observed. Such reduction is ascribed to the weak interaction between PANI and MnSe$_2$ within the PANI:MnSe$_2$ composite. Overall, testing shows that the solid-state ASCs possess large energy storage capacity and long-term electrochemical charge-discharge cycling stability.

Fabrication and Characterization of the Wireless Portable Light-Weight Self-Charging Power Packs Fabrication of the wireless portable light-weight self-charging power packs: Tandem solar cells by ternary OSCs and PSCs are fabricated as described above in *Fabrication and characterization of tandem solar cells*. Afterward, a solution-processed electrical polymeric thin film, the FAI treated PEDOT:PSS thin film (where FAI is formamidinium iodide) was fabricated on the top of the Ag electrode of tandem solar cells according to methods disclosed in Zhu, T., Yang, Y., Zheng, L., Liu, L., Becker, M. L., Gong, X., *Solution-Processed Flexible Broadband Photodetectors with Solution-Processed Transparent Polymeric* Electrode. Adv. Funct. Mater. 2020, 30, 1909487 and Tao Zhu, Yongrui Yang, Xiang Yao, Zixu Huang, Lei Liu, Wenping Hu, and Xiong Gong, *Solution-Processed Polymeric Thin Film as the Transparent Electrode for Flexible Perovskite Solar Cells*, ACS Applied Materials & Interfaces 2020 12 (13), 15456-15463, which are herein incorporated by reference. Then the PANI:MnSe2/CC electrode was attached on the top of the FAI treated PEDOT:PSS thin film. Finally, the solid-state ASCs are completed with the method described above in Fabrication and characterization of the solid-state ASCs.

Assembly of Self-Powered Devices

The asymmetric solid-state supercapacitors are combined with tandem solar cells by the conducting tapes purchased from Electron Microscopy Sciences. Firstly, the carbon cloth is combined with a piece of conducting film by a hydraulic press, and the solid-state supercapacitor electrode materials are deposited on the carbon cloth side. The solid-state supercapacitors are sealed by photocuring attachment, then use conducting tape to attach the solid-state supercapacitors to the bottom of the solar cells. Using a multi-post clip purchased from 3M to switch the conversion and storage modes. The instruments to measure the electrochemical performance of the self-powered devices are same as before.

The energy storage efficiency is calculated by the following expression:

$$\eta_{storage} = \eta_{overall}/\eta_{conversion}$$

where $\eta_{storage}$ means energy storage efficiency. $\eta_{overall}$ is the overall efficiency of the self-powered devices. $\eta_{conversion}$ stands for the power conversion efficiency of the solar cells.

At the current density of 1 mA/cm$^2$, the wireless portable light-weight self-charging power packs exhibit a $\eta_{overall}$ of 12.43%, which is much higher than what is known in the art. Even at the current density of 10 mA/cm$^2$, the wireless portable light-weight self-charging power packs still possess a $\eta_{overall}$ of 5.36%. Such excellent device performance is attributed to both high PCE and large $V_{OC}$ from tandem solar cells and high energy density from the solid-state ASCs. A $\eta_{storage}$ of 72.4% is calculated for wireless portable light-weight self-charging power packs. Such high $\eta_{storage}$ indicates that tandem solar cells are matched with solid-state ASCs very well.

Characterization of the Wireless Portable Light-Weight Self-Charging Power Packs A Newport Air Mass 1.5 Global (AM1.5G) full-spectrum solar simulator was supplied as the light source. The GCD data measurements were performed on Gamry reference 3000 electrochemical workstations (Gamry Instruments, U.S.A).

The self-charging power packs is integrated by tandem solar cells with solid-state ASCs through solution-processed electrically conductive polymeric thin film rather than metal wires. Similar to the metal wires, the electrically conductive polymeric thin film is used to facilitate the transportation of the generated photocurrent from tandem solar cells to the solid-state ASCs, resulting in the integration of solar energy generation and storage into one electrical circuit. Since both PSCs-OSCs tandem solar cells and solid-state ASCs developed in this study are portable and light-weight, and above two different devices are wireless connected through solution-processed electrically conductive polymeric thin film rather than metal wires, the self-charging power packs possess portable, light-weight and wireless connection advanced features.

The specific capacitances of the wireless portable light-weight self-charging power packs at different discharging current densities were found. It is found that after integrating with tandem solar cells, the solid-state ASCs maintained a specific capacitance of 234 mF/cm$^2$ at the discharging current density of 1 mA/cm$^2$ and a specific capacitance of 100 mF/cm$^2$ at the discharging current density of 10 mA/cm$^2$. These results indicate that the wireless portable light-weight self-charging power packs have a good energy capacity in a wide range of current densities.

The voltage observed from solid-state ASCs charged by PSCs-OSCs tandem solar cells is 1.41 V, which is smaller than that (1.50 V) by an electrochemical station. Both of which are smaller than the operational window (1.60 V) observed from solid-state ASCs. These results illustrate that both tandem solar cells and an electrochemical station are unable to charge solid-state ASCs to its full operational voltage. Such voltage loss is probably due to poor electrical conductivity of solution-processed polymeric thin film. More voltage loss observed from solid-state ASCs charged by tandem solar cells is probably ascribed to the reduced power output from tandem solar cells and large contact resistance between solid-state ASCs and tandem solar cells.

In the forgoing, tandem solar cells are fabricated by PSCs combined with ternary OSCs. In some embodiments, the PSCs-OSCs tandem solar cells of this invention exhibit a VOC of 1.64 V and a PCE of 17.16%, which in impressive in the current state of the art. The forgoing also provides for the development of asymmetric solid-state supercapacitors (ASCs) including both a novel positive electrode and a solid-state polymeric electrolyte. In some embodiments, the solid-state ASCs exhibit an operational voltage of 1.60 V, an energy density of 42.1 Wh/kg and a cycling stability of 2000 cycles. In particularly useful embodiments, the tandem solar cells and asymmetric solid-state supercapacitors are used to develop solution-processed self-charging power packs by integrating the PSCs-OSCs tandem solar cells with solid-state ASCs through a solution-processed electrically conductive polymeric thin film. The self-charging power packs not only possess portable, light-weight and wireless connection advanced features, but also exhibit outstanding electric-circuit device performance—in some embodiments having an overall efficiency of 12.43% and an energy storage efficiency of 72.4% under white light illumination.

What is claimed is:

1. A wireless self-charging power pack comprising:
a solution processed conductive thin film;
a tandem solar cell comprising a ternary organic solar cell and a perovskite solar cell, wherein the ternary organic solar cell and the perovskite solar cell are connected via shared intermediate layers comprising an M-PEDOT: PSS layer which includes a PEDOT: PSS solution and a PSS solution, an SnO2 layer, and a PFN-OX layer, wherein the M-PEDOT: PSS layer is located adjacent to a ternary organic photoactive layer, wherein the SnO$_2$ layer is located adjacent to the M-PEDOT: PSS layer, and wherein the PFN-OX layer is located adjacent to the SnO$_2$ layer;
wherein the ternary organic solar cell comprises:
an electrode cover layer;
an electron extraction layer;
the ternary organic photoactive layer;
the shared intermediate layers; and
wherein the perovskite solar cell comprises:
the shared intermediate layers;
a perovskite photoactive layer adjacent to the PFN-OX layer;
a hole extraction layer;
an electrode layer; and
a solid-state supercapacitor;
wherein the solution processed conductive thin film is a polymeric thin film including a conductive organic material treated with an organic additive, and wherein the solution processed conductive thin film facilitates transportation of a generated photocurrent from the solar cell to the solid-state supercapacitor in a single electrical circuit.

2. The wireless self-charging power pack of claim 1, wherein the solution processed conductive thin film has an electrical conductivity of 1000 S/cm or greater.

3. The wireless self-charging power pack of claim 1, wherein the conductive organic material is PEDOT: PSS and the organic additive is formamidinium iodide.

4. The wireless self-charging power pack of claim 1, wherein the electron extraction layer comprises zinc oxide, wherein the ternary organic photoactive layer comprises PTB7-DT, $PC_{71}BM$, and O6T-4F, in the form of a bulk heterojunction, wherein the perovskite photoactive layer is $CH_3NH_3PbI_3$, wherein the hole extraction layer is spiro-OMeTAD, and wherein the electrode layer is Ag, silver.

5. The wireless self-charging power pack of claim 1, wherein the solid-state supercapacitor comprises:
   a first electrode;
   a second electrode; and
   a solid-state electrolyte.

6. The wireless self-charging power pack of claim 5, wherein the first electrode comprises a conductive polymer and a metal in the form of a composite.

7. The wireless self-charging power pack of claim 6, wherein the composite comprises a polyaniline and $MnSe_2$ composite disposed on carbon cloth, wherein the polyaniline and $MnSe_2$ composite is polyaniline mixed with MnSe2 nanoparticles, and wherein a ratio of polyaniline to MnSe2 nano particles is from 1:1 to 75:1.

8. The wireless self-charging powerpack of claim 5, wherein the second electrode comprises 2-dimensional materials disposed on carbon cloth.

9. The wireless self-charging power pack of claim 8, wherein the second electrode comprises a reduced graphene oxide disposed on carbon cloth.

10. The wireless self-charging power pack of claim 5, wherein the solid-state electrolyte comprises a polymer gel.

11. The wireless self-charging power pack of claim 10, wherein the polymer gel comprises $PVA:H_2SO_4$ gel.

12. The wireless self-charging power pack of claim 1, wherein the shared intermediate layers have a total thickness of from 60 nm to 120 nm.

13. The wireless self-charging power pack of claim 1, the M-PEDOT:PSS layer is from 25 nm to 50 nm thick.

14. The wireless self-charging power pack of claim 1, wherein the SnO2 layer is from 25 nm to 40 nm thick.

15. The wireless self-charging power pack of claim 1, wherein the PFN-OX layer is from 2 nm to 10 nm thick.

16. The wireless self-charging power pack of claim 1, wherein the thickness of the M-PEDOT:PSS layer is 40 nm, the thickness of the $SnO_2$ layer is 30 nm, and the thickness of the PFN-OX layer is 5 nm.

17. The wireless self-charging power pack of claim 1, wherein the shared intermediate layers are the product of independently annealed solutions of M-PEDOT:PSS, $SnO_2$, and PFN-OX.

18. The wireless self-charging power pack of claim 1, wherein the ternary organic photoactive layer has a thickness of from 100 nm to 150 nm.

19. The wireless self-charging power pack of claim 1, wherein the tandem solar cell has an absorption spectral range of light with 300 nm to 1100 nm wavelengths.

* * * * *